United States Patent
Kim et al.

(10) Patent No.: US 9,293,797 B2
(45) Date of Patent: Mar. 22, 2016

(54) RF SWITCH WITH TRANSFORMER AND SWITCHING METHOD THEREOF

(71) Applicant: KOREA ELECTRONICS TECHNOLOGY INSTITUTE, Seongnam-si, Gyeonggi-do (KR)

(72) Inventors: Ki Jin Kim, Gwangju-si (KR); Kwang Ho Ahn, Yongin-si (KR); Sang Hoon Park, Seoul (KR)

(73) Assignee: KOREA ELECTRONICS TECHNOLOGY INSTITUTE, Seongnam-Si, Gyeonggi-Do (KR)

( * ) Notice: Subject to any disclaimer, the term of this patent is extended or adjusted under 35 U.S.C. 154(b) by 121 days.

(21) Appl. No.: 14/080,294

(22) Filed: Nov. 14, 2013

(65) Prior Publication Data

US 2014/0139298 A1     May 22, 2014

(30) Foreign Application Priority Data

Nov. 19, 2012    (KR) ........................ 10-2012-0131030

(51) Int. Cl.
*H01P 1/10* (2006.01)
*H03K 17/693* (2006.01)
*H04B 1/48* (2006.01)

(52) U.S. Cl.
CPC ................ *H01P 1/10* (2013.01); *H03K 17/693* (2013.01)

(58) Field of Classification Search
CPC ............. H03H 7/42; H03H 7/422; H01P 1/15
USPC ................ 333/25, 26, 101, 103, 105
See application file for complete search history.

(56) References Cited

U.S. PATENT DOCUMENTS

| | | | | |
|---|---|---|---|---|
| 7,369,096 | B2 * | 5/2008 | Castaneda et al. | 343/859 |
| 7,899,409 | B2 * | 3/2011 | Huang et al. | 455/78 |
| 8,368,481 | B2 * | 2/2013 | Jin et al. | 333/25 |
| 8,964,605 | B1 * | 2/2015 | Ansari | 370/278 |
| 2009/0273411 | A1 * | 11/2009 | Roufoogaran | 333/25 |
| 2012/0139658 | A1 * | 6/2012 | Mu | 333/25 |

FOREIGN PATENT DOCUMENTS

KR    1020090110824 A    10/2009

OTHER PUBLICATIONS

Korean Office Action for application No. 10-2012-0131030 dated Feb. 19, 2014.

* cited by examiner

*Primary Examiner* — Dean Takaoka
(74) *Attorney, Agent, or Firm* — Hauptman Ham, LLP

(57) ABSTRACT

A radio frequency (RF) switch with a transformer and a switching method thereof are provided. The RF switch includes a transmitting end transformer having a primary side connected to a transmitting end and a secondary side connected to an antenna; and a receiving end transformer having a primary side connected to the antenna and a secondary side connected to a receiving end. In a transmission mode, the transmitting end transformer is tuned on, and, in a reception mode, the receiving end transformer is turned on. Accordingly, since switching is performed based on transformers rather than transistors connected in series, the RS switch, which can achieve high linearity and low insertion loss as well as high isolation, can be implemented.

9 Claims, 5 Drawing Sheets

RF SWITCH WITH TRANSFORMER AND SWITCHING METHOD THEREOF

CROSS-REFERENCE TO RELATED APPLICATION(S) AND CLAIM OF PRIORITY

The present application claims the benefit under 35 U.S.C. §119(a) to a Korean patent application filed in the Korean Intellectual Property Office on Nov. 19, 2012, and assigned Serial No. 10-2012-0131030, the entire disclosure of which is hereby incorporated by reference.

TECHNICAL FIELD OF THE INVENTION

Methods and apparatuses consistent with exemplary embodiments relate to a radio frequency (RF) switch, and more particularly, to an RF switch which is used at an RF front end in a time division duplex (TDD) system.

BACKGROUND OF THE INVENTION

FIG. 1 is a view illustrating an RF front end in a TDD system. Since the RF front end shown in FIG. 1 does not operate a receiving end (Rx) in a transmission mode and does not operate a transmitting end (Tx) in a reception mode, the RF front end may be managed by a single antenna. However, the RF front end further requires a switch.

A power amplifier (PA) to increase output of the transmitting end (Tx) is mainly designed in a differential method, and a low noise amplifier (LNA) is also designed in the differential method to minimize common mode noise and ground effect in the RF front end module. Therefore, the RF front end further requires a balun as shown in FIG. 1.

A module that is manufactured by combining the switch and the baluns as shown in FIG. 1 is called an analog front end (AFE). In the multi-band or multi-mode wireless communication environment, the increase in manufacturing costs and system size of the AFE is becoming a problem.

To solve this problem of the AFE, a method for substituting this module with a chip has been suggested. Specifically, an RF switch with a complementary metal-oxide semiconductor (CMOS) transistor as shown in FIG. 2 is the representative method.

In the RF switch shown in FIG. 2, transistors are arranged such that a transmitting end (Tx) and a receiving end (Rx) are symmetric to each other. When "SW" is a high level, $T_{s2}$ is turned on and $T_{p2}$ is turned off, and the receiving end (Rx) is connected to an antenna. At this time, $T_{s1}$ is turned off at the transmitting end (Tx) and prevents signals from entering the transmitting end (Tx) from the antenna, and $T_{p1}$ is turned on and grounds the signals passing through $T_{s1}$, thereby guaranteeing isolation.

However, the transmission signal output from the transmitting end (Tx) is a high output signal that passes through the PA. Accordingly, linearity cannot be guaranteed while the signal passes through $T_{s1}$ which shows non-linearity with respect to the high output signal, and also, great loss may be caused.

In the case of the receiving end (Rx), the loss caused by $T_{s2}$ undermines the whole noise figure of the system.

Therefore, the RF switch shown in FIG. 2 guarantees high isolation, but causes side effects such as non-linearity and high insertion loss.

SUMMARY OF THE INVENTION

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide an RF switch which can guarantee high isolation and also have performances of high linearity and low insertion loss.

According to an aspect of an exemplary embodiment, there is provided a radio frequency (RF) switch including: a transmitting end transformer having a primary side connected to a transmitting end and a secondary side connected to an antenna; and a receiving end transformer having a primary side connected to the antenna and a secondary side connected to a receiving end. In a transmission mode, the transmitting end transformer may be tuned on, and, in a reception mode, the receiving end transformer may be turned on.

In the transmission mode, the receiving end transformer may be turned off, and, in the reception mode, the transmitting end transformer may be turned off.

The RF switch may further include: a transmitting end switch connected to the primary side of the transmitting end transformer in parallel and turned off in the transmission mode, thereby opening the transmitting end; and a receiving end switch connected to the secondary side of the receiving end transformer in parallel and turned off in the reception mode, thereby opening the receiving end.

The transmitting end switch may be turned on and may short-circuit the transmitting end in the reception mode, and the receiving end switch may be turned on and may short-circuit the receiving end in the transmission mode.

The secondary side of the transmitting side transformer and the primary side of the receiving end transformer may be connected to each other in series.

The RF switch may further include a capacitor switch array (CSA) which is connected to the secondary side of the transmitting end transformer and the primary side of the receiving end transformer in parallel, and performs impedance matching by selectively combining a plurality of capacitors.

According to an aspect of another exemplary embodiment, there is provided an RF switching method including: in a transmission mode, turning on a transmitting end transformer which has a primary side connected to a transmitting end and a secondary side connected to an antenna; and, in a reception mode, turning on a receiving end transformer which has a primary side connected to the antenna and a secondary side connected to a receiving end.

According to the exemplary embodiments as described above, since switching is performed based on transformers rather than transistors connected in series, the RS switch, which can achieve high linearity and low insertion loss as well as high isolation, can be implemented.

BRIEF DESCRIPTION OF THE DRAWINGS

The above and/or other aspects will be more apparent by describing in detail exemplary embodiments, with reference to the accompanying drawings, in which.

DETAILED DESCRIPTION OF THE INVENTION

Figure 1:
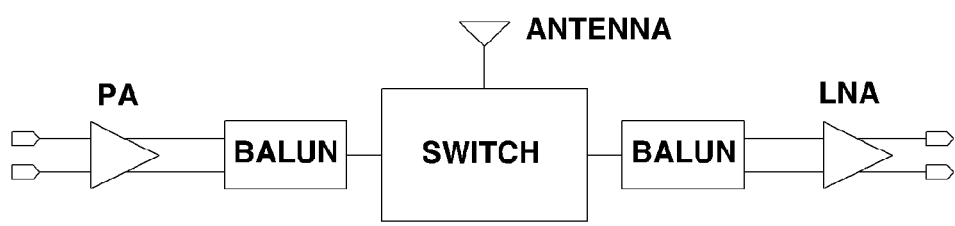
FIG. 1 is a view illustrating an RF front end in a TDD system.
Figure 2:
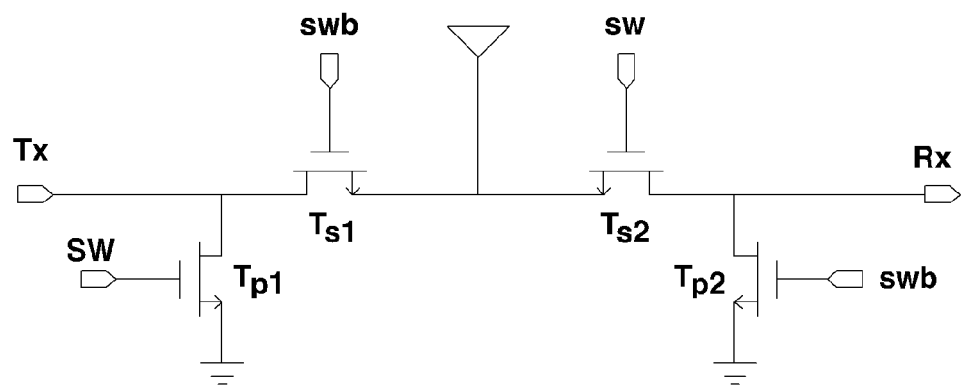
FIG. 2 is a circuit diagram of an RF switch with a CMOS transistor.

Hereinafter, exemplary embodiments will be described in greater detail with reference to the accompanying drawings.

In the following description, same reference numerals are used for the same elements when they are depicted in different drawings. The matters defined in the description, such as detailed construction and elements, are provided to assist in a comprehensive understanding of exemplary embodiments. Thus, it is apparent that exemplary embodiments can be carried out without those specifically defined matters. Also, functions or elements known in the related art are not described in detail since they would obscure the exemplary embodiments with unnecessary detail.

Figure 3:
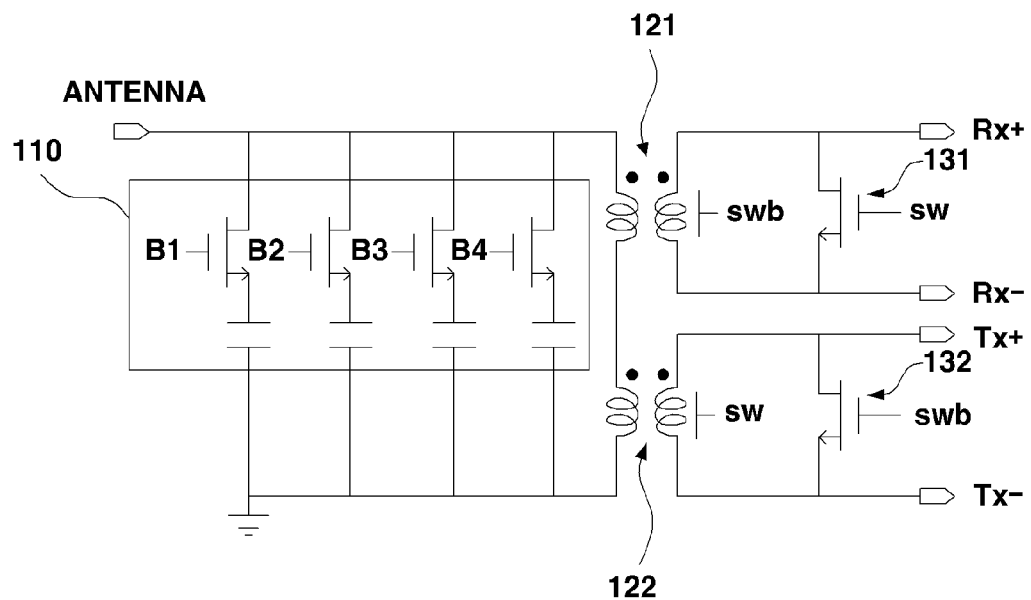
FIG. 3 is a circuit diagram of an RF switch with a transformer according to an exemplary embodiment.

FIG. 3 is a circuit diagram of an RF switch with a transformer according to an exemplary embodiment. The RF switch 100 according to the present exemplary embodiment is a switch for matching and isolation between a transmitting end (Tx) and a receiving end (Rx) at an RF front end for wireless communication of a TDD scheme.

The RF switch 100 according to the present exemplary embodiment performs a switching operation based on a transformer, thereby achieving high isolation between the transmitting end and the receiving end, high linearity, and low insertion loss.

The RF switch 100, which shows such performance according to the present exemplary embodiment, includes a capacitor switch array (CSA) 110, a receiving end transformer 121, a transmitting end transformer 122, a receiving end switch 131, and a transmitting end switch 132.

The receiving end transformer 121 has a primary side connected to an antenna and a secondary side connected to a receiving end (Rx). On the contrary, the transmitting end transformer 122 has a primary side connected to a transmitting end (Tx) and a secondary side connected to the antenna.

Also, the receiving end switch 131 is connected to the secondary side of the receiving end transformer 121 in parallel. The transmitting end switch 132 is connected to the primary side of the transmitting end transformer 122 in parallel.

In a transmission mode, "SW" is a high level and "SWb(ar)" is a low level.

Accordingly, in the transmission mode, the transmitting end transformer 122 is turned on and the receiving end transformer 121 is turned off. Also, the transmitting end switch 132 is turned off and opens the transmitting end (Tx), thereby forwarding a transmission signal output from the transmitting end (Tx) to the antenna through the transmitting end transformer 122.

On the other hand, the receiving end switch 131 is turned on and short-circuits the receiving end (Rx), thereby doubly preventing the transmission signal from entering the receiving end (Rx).

On the contrary, in a reception, "SW" is a low level and "SWb(ar)" is a high level.

Accordingly, in the reception mode, the receiving end transformer 121 is turned on and the transmitting end transformer 122 is turned off. Also, the receiving end switch 131 is turned off and opens the receiving end (Rx), thereby forwarding a reception signal entering from the antenna through the receiving end transformer 122 to the receiving end (Rx).

On the other hand, the transmitting end switch 132 is turned on and short-circuits the transmitting end (Tx), thereby doubly preventing the reception signal from entering the transmitting end (Tx).

The primary side of the receiving end transformer 121 and the secondary side of the transmitting end transformer 122 are connected to each other in series. Also, the CSA 110 is connected to the primary side of the receiving end transformer 121 and the secondary side of the transmitting end transformer 122, which are connected to each other in series, in parallel.

The CSA 110 is provided with a plurality of capacitors and a plurality of switches which are connected to the plurality of capacitors in series. The CSA 110 performs impedance matching by selectively combining the capacitors with the switches. To achieve maximum transmission efficiency, a frequency caused by inductance at input sides of the transformers 121 and 122 and capacitance of the CSA 110 should be a resonant frequency.

According to the present exemplary embodiment, by connecting the receiving end switch 131 and the transmitting end switch 132 to the receiving end (Rx) and the transmitting end (Tx), respectively, in parallel in the RF switch 100, non-linearity and loss which arise when they are connected in series can be solved.

The RF switch 100 according to the present exemplary embodiment guarantees linearity which results from passive element characteristics, as well as isolation, using the transformers 121 and 122 which show the passive element characteristics.

Also, the transformers 121 and 122 provide a balun function by themselves such that both the receiving end (Rx) and the transmitting end (Tx) can exclude the balun.

Accordingly, loss caused by the balun as well as loss caused by the switches (transistors) connected in series are integrated into the transformer insertion loss and minimized Also, since the inductance for impedance matching necessary for optimal performance of a PA and an LNA is provided by the transformers 121 and 122, any separate inductor is not required and thus the number of parts can be reduced and also the insertion loss can be reduced.

Figure 4:
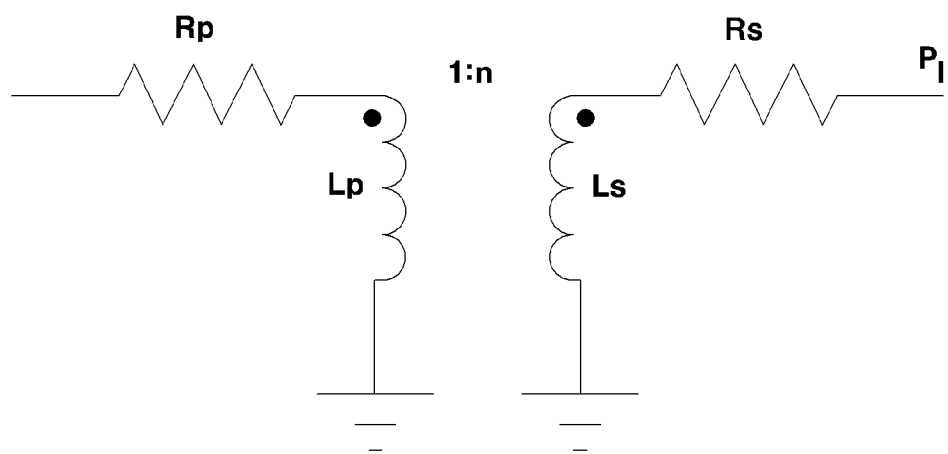
FIG. 4 is an equivalent circuit diagram of the transformer shown in FIG. 3.
Figure 5:
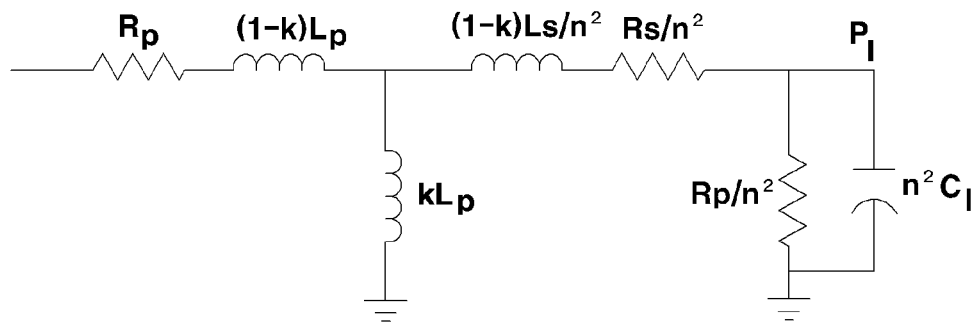
FIG. 5 is a circuit diagram which is a result of schematically modeling a power transmission characteristic of the transformer from the equivalent circuit shown in FIG. 4.

FIG. 4 illustrates an equivalent circuit of the transformers 121 and 122 shown in FIG. 3, and FIG. 5 is a circuit diagram which is a result of schematically modeling a power transmission characteristic of the transformers 121 and 122 from the equivalent circuit shown in FIG. 4.

A power transmission function may be calculated based on the circuit diagram shown in FIG. 5 as follows:

$$\frac{Pload}{Ptf} = \frac{Rl}{n^2 \left( \frac{\frac{wLp}{Qs} + \frac{Rl}{n^2}}{wkLp} \right)^2 \times \frac{wLp}{Qp} + \frac{wLp}{Qs} + Rl/n^2} = \eta$$

As can be seen from the above transmission function, when on resistance values of the receiving end switch 131 and the transmitting end switch 132 are reduced, output of the transmitting end (Tx) is not forwarded to the receiving end (Rx) and are mostly forwarded to the antenna.

The resistance of the switches 131 and 132 decreases as a difference between a 'gate voltage' and 'a source voltage and a drain voltage' of the switches 131 and 132 increases. In the present exemplary embodiment, the gate voltage and opposite polarity of the switches 131 and 132 are applied to a center (virtual ground node) of the transformers 121 and 122. Accordingly, a turn-on state and a turn-off state of the switches 131 and 132 are more clearly distinguished from each other, such that isolation is maximized.

Figure 6:
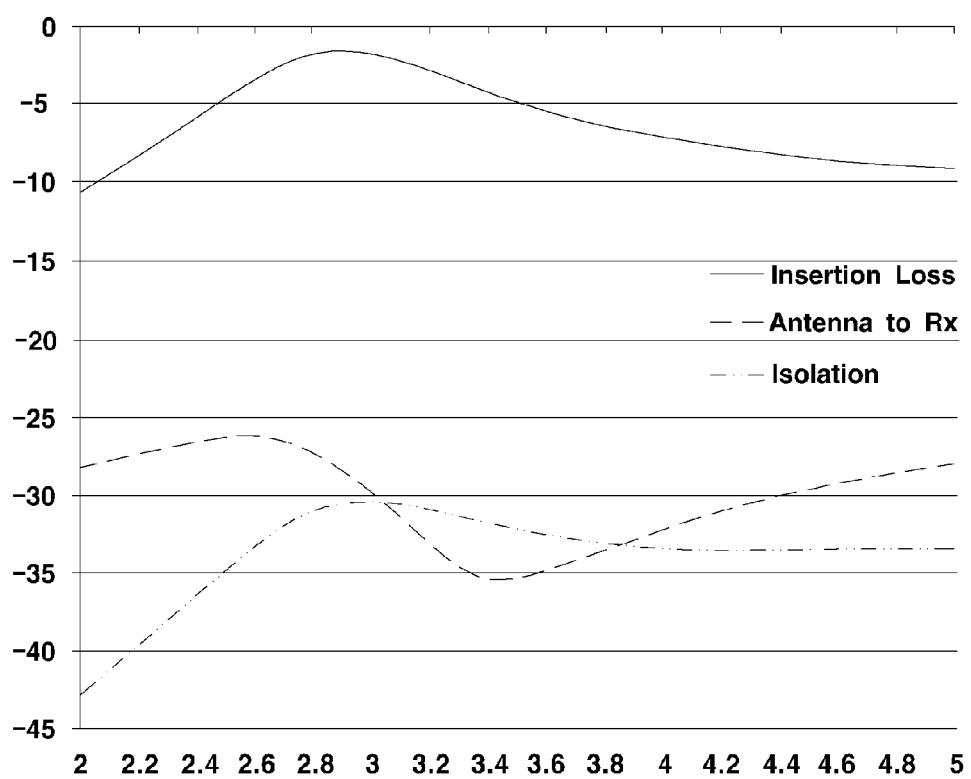
FIG. 6 is a graph showing a result of computer-simulating insertion loss and isolation characteristics of an RF switch according to an exemplary embodiment.

FIG. 6 is a graph showing a result of computer-simulating insertion loss and isolation characteristics of the RF switch 100 according to the present exemplary embodiment. In the graph shown in FIG. 6, the unit of the x-axis is GHz and the unit of the y-axis is dB.

It can be seen that the minimum value of the insertion loss is 1.8 dB. This value may be seen as being very small considering that the loss includes loss in a balun and loss in an inductor for impedance matching.

Also, referring to the isolation characteristic, isolation at a port blocked by the antenna is −26 dB and isolation between Tx and Rx is −31 dB. That is, it can be seen that the RF switch 100 according to the present exemplary embodiment has a high isolation characteristic.

Figure 7:
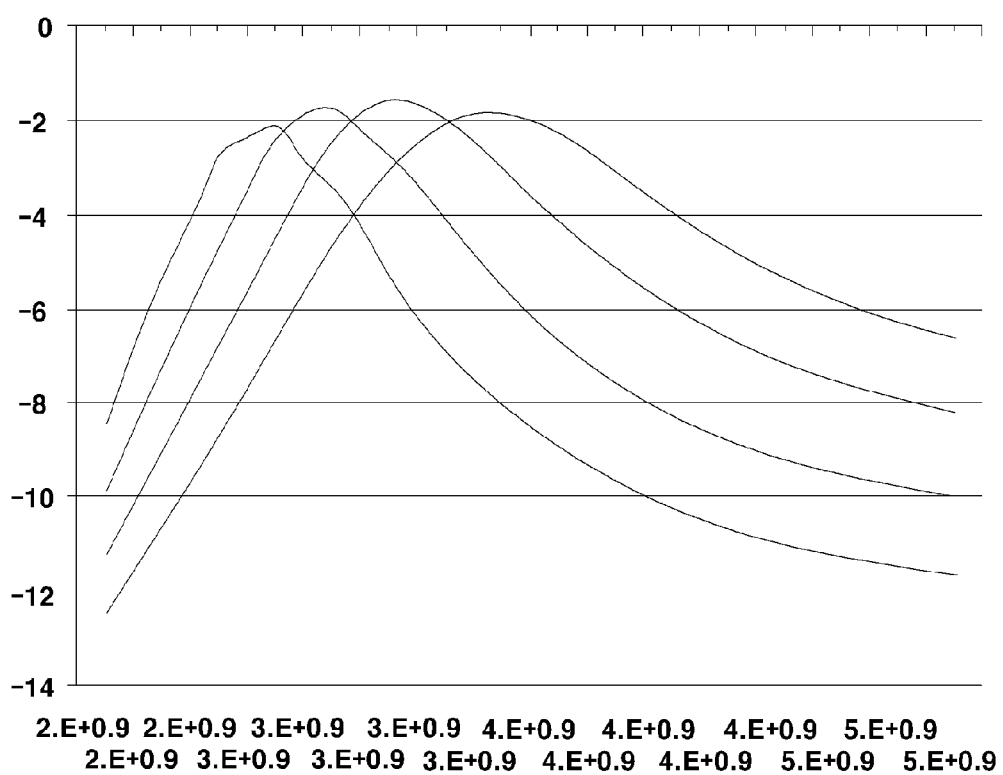
FIG. 7 is a graph showing a result of simulating a capacitor switch array (CSA) of an RF switch according to an exemplary embodiment.

FIG. 7 is a graph showing a result of simulating the CSA 110 of the RF switch 100 according to the present exemplary embodiment. Referring to FIG. 7, since insertion loss is 2 dB in the section of 3-4 GHz, it can be seen that the RF switch 100 shows good performance in broadband.

The foregoing exemplary embodiments and advantages are merely exemplary and are not to be construed as limiting the present inventive concept. The exemplary embodiments can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A radio frequency (RF) switch, comprising:
   a transmitting end transformer having a primary side connected to a transmitting end and a secondary side connected to an antenna;
   a receiving end transformer having a primary side connected to the antenna and a secondary side connected to a receiving end;
   a transmitting end switch connected in parallel to the primary side of the transmitting end transformer, and configured to be turned off in a transmission mode to open the transmitting end; and
   a receiving end switch connected in parallel to the secondary side of the receiving end transformer, and configured to be turned off in a reception mode to open the receiving end,
   wherein, in the transmission mode, the transmitting end transformer is tuned on and the receiving end transformer is turned off, and
   wherein, in the reception mode, the receiving end transformer is turned on and the transmitting end transformer is turned off.

2. The RF switch as claimed in claim 1, wherein
   the transmitting end switch is configured to turn on or off in accordance with a first gate voltage applied to a gate of the transmitting end switch, and the first gate voltage is applied to a virtual ground node of the receiving end transformer, and
   the receiving end switch is configured to turn on or off in accordance with a second gate voltage applied to a gate of the receiving end switch, and the second gate voltage is applied to a virtual ground node of the transmitting end transformer.

3. The RF switch as claimed in claim 2, wherein the first gate voltage is an inverted signal of the second gate voltage.

4. The RF switch as claimed in claim 1,
   wherein, in reception mode, the transmitting end switch is turned on and short-circuits the transmitting end,
   wherein, in the transmission mode, the receiving end switch is turned on and short-circuits the receiving end.

5. The RF switch as claimed in claim 1, wherein the secondary side of the transmitting side transformer and the primary side of the receiving end transformer are connected to each other in series.

6. The RF switch as claimed in claim 5, further comprising,
   a capacitor switch array (CSA) which is connected in parallel to a series circuit including the secondary side of the transmitting end transformer and the primary side of the receiving end transformer, said CSA comprising a plurality of capacitors and configured to perform impedance matching by selectively combining the plurality of capacitors.

7. A radio frequency (RF) switching method for an RF switch,
   the RF switch including
      a transmitting end transformer having a primary side connected to a transmitting end and a secondary side connected to an antenna,
      a receiving end transformer having a primary side connected to the antenna and a secondary side connected to a receiving end,
      a transmitting end switch connected in parallel to the primary side of the transmitting end transformer, and
      a receiving end switch connected in parallel to the secondary side of the receiving end transformer,
   the method comprising:
      in a transmission mode,
         turning on the transmitting end transformer,
         turning off the receiving end transformer, and
         transmitting a transmission signal to the antenna through the transmitting end transformer, by turning off the transmitting end switch; and
      in a reception mode,
         turning on the receiving end transformer,
         turning off the transmitting end transformer, and
         receiving a reception signal from the antenna and forwarding the reception signal to the receiving end through the receiving end transformer, by turning off the receiving end switch.

8. The RF switching method as claimed in claim 7, wherein
   the transmitting end switch is turned on or off in accordance with a first gate voltage applied to a gate of the transmitting end switch, and the first gate voltage is applied to a virtual ground node of the receiving end transformer, and
   the receiving end switch is turned on or off in accordance with a second gate voltage applied to a gate of the receiving end switch, and the second gate voltage is applied to a virtual ground node of the transmitting end transformer.

9. The RF switching method as claimed in claim 8, wherein the first gate voltage is an inverted signal of the second gate voltage.

* * * * *